United States Patent [19]

Galian et al.

[11] Patent Number: 4,939,621
[45] Date of Patent: Jul. 3, 1990

[54] DEVICES FOR REGULATING THE TEMPERATURE OF AN ELEMENT BY BLOWING A GAS AT APPROPRIATE TEMPERATURE

[75] Inventors: Francois Galian, Pontault-Combault; André Feuillioux, Montlucon, both of France

[73] Assignee: Societe d'Applications Generales d'Electricite Generale et de Mecanique Sagem, France

[21] Appl. No.: 350,299

[22] Filed: May 5, 1989

[30] Foreign Application Priority Data

May 10, 1988 [FR] France .................. 88 06293

[51] Int. Cl.⁵ ............................. H05K 7/20
[52] U.S. Cl. ......................... 361/382; 165/61; 357/82; 361/384
[58] Field of Search ............. 165/61; 174/16.1, 15.1; 285/226; 357/82; 361/382, 383, 384

[56] References Cited

U.S. PATENT DOCUMENTS

| 4,729,060 | 3/1988 | Yamamoto | 361/382 |
| 4,740,866 | 4/1988 | Kajiwara | 361/382 |
| 4,750,086 | 6/1988 | Mittal | 361/382 |
| 4,866,570 | 9/1989 | Porter | 361/382 |

FOREIGN PATENT DOCUMENTS 656740 7/1986 Switzerland.

Primary Examiner—Gerald P. Tolin
Attorney, Agent, or Firm—Larson and Taylor

[57] ABSTRACT

A thermal regulation device is provided for regulating, to a desired value, the temperature of an element (7) by blowing a gas at the desired temperature thereon, comprising: a body (1) containing a duct (2) feeding the gas; an insulating bell (6) mounted for sliding on the end (3) of the duct for surrounding the element (7); a bellows (15) between the bell (6) and the body (1); a tube (19) enclosed in the body (1) for discharging the gas out of the bell; the bell and the bellows being made from a heat insulating material.

5 Claims, 1 Drawing Sheet

DEVICES FOR REGULATING THE TEMPERATURE OF AN ELEMENT BY BLOWING A GAS AT APPROPRIATE TEMPERATURE

BACKGROUND OF THE INVENTION

The present invention relates to thermal regulation devices used for regulating, to a desired positive or negative value, the temperature of an element, particularly a semi-conductor component, during electric testing under variable thermal conditions (e.g. between −65° and +210° C.), this temperature regulation being obtained by blowing a gas at the desired temperature on said element, this thermal regulation device comprising a body supporting an intake duct for the gas at the appropriate temperature and means for insulating the element with respect to the ambient atmosphere, these insulating means comprising an insulating bell adapted to cover the element and supported slidingly by the free end of said duct, resilient means being inserted between the insulating bell and the body of the device for holding said bell in sealed resilient application against the support of the element with which is cooperates.

FIG. 1 of the accompanying drawings shows schematically, in cross section, an arrangement of a device in accordance with the state of the art. The body 1 of the device (which is simply suggested in the drawing and whose inner equipment has not been shown)—which may be suspended for example from a bracket facilitating its positioning and removal—contains a duct 2 conveying the thermal regulation gas (at a positive or negative temperature) supplied by a source (not shown). The lower end 3 of duct 2 is surrounded by a sliding sleeve 4 urged resiliently downwards by a helical spring 5 surrounding the lower end of duct 2. Sleeve 4 supports a bell 6, e.g. made from rubber, which is dimensioned and configured so as to be able to cover an element 7, e.g. an integrated circuit during electric testing under variable thermal conditions. The lower edge of bell 6 is held sealingly and resiliently applied, by spring 5, against the surface of support 8 of the component 7 (in the drawing support 8 is shown with element 7, alone, the electric connector providing the mechanical retention of the component and the electric connections with the test circuit not being shown for simplifying the representation).

Furthermore, an enclosure 11 for recovering the gases, fast with the lower portion of body 1, surrounds bell 6 and is defined by an insulating ceiling 9a through which duct 2 passes and by sidewalls 9 formed by a double glass partition.

The temperature regulation gas is fed into bell 6 through duct 2 whose lower end 3 opens above element 7, escapes through orifices 10 pierced in the sidewalls thereof, then is finally discharged from enclosure 11 through a discharge orifice 12 provided in ceiling 9a. A dry air intake is provided through an orifice 13, emerging between the two glass walls of the double wall 9 so as to avoid condensation of the humidity of the ambient atmosphere and frosting up thereof during low temperature tests.

This known arrangement has numerous drawbacks.

First of all, this structure is as a whole heavy, cumbersome and complex and therefore expensive to purchase and not very practical in use. In addition, the presence of the double glass wall 9 limits the vertical free movement of bell 6. Moreover, in order to avoid discharge of the gases into the atmosphere directly on leaving give rise to frosting up, during low temperature tests, in the immediate vicinity of the device and so as to avoid also the discharge of gas at the height of the face of the operator controlling the operation of the apparatus, a discharge tube 14 is fixed to orifice 12 which is sufficiently long and conformed so that the gases are discharged further away; however, this tube 19 is cumbersome and hinders the handling of the device.

Different tests have been made to attempt to simplify this known structure, but none has given satisfaction up to now.

SUMMARY OF THE INVENTION

The object of the invention is essentially to overcome the above mentioned drawbacks and to provide an improved arrangement of the thermal regulation device of the above defined type which is a simpler, less cumbersome and less expensive structure than presently known devices and which is also of a more practical design in use and which hinders the operator less.

To achieve these objects, a thermal regulation device formed in accordance with the invention is essentially characterized by the combination of the following arrangements:

- between the insulating bell and the body is inserted a tubular bellows substantially coaxial with the gas intake duct and defining an annular chamber with the opposing walls of the insulating bell, of the body and of the duct, said bellows being further adapted to play the role of said resilient means holding the bell resiliently and sealingly applied against the surface of the support of the element;
- the bell and the bellows are both made from a material or from respective materials which are very good heat insulators;
- the bell is provided with at least one passage for communication between its inner volume and said annular chamber;
- the body of the device has passing therethrough, over the whole of its height, a discharge tube opening into the annular chamber at its lower end and emerging into the atmosphere at its upper end.

With this arrangement, a much more compact and much less fragile structure is obtained than prior art structures because the glass walls used up to now have purely and simply disappeared; the vertical free movement of the bell may take place with a great amplitude if desired, because of the suppression of the vertical stops formed by these same glass walls; because the discharge tube is integrated in the very body of the device and opens into the upper part thereof, the environment of the head is no longer encumbered by this tube, which leaves greater freedom of manoeuvre for the operator, and the discharge of the gases takes place at a sufficient height and in a direction (generally upwards) which again causes no hindrance. Because of the use of a very good heat insulating material (such as silicone rubber for example) to form the bell and the bellows, there is no frosting up of their respective external surfaces during very low temperature tests.

In a preferred embodiment, the bellows has a relatively thick wall (which in any case would be too thin to provide the necessary thermal insulation) and, in the operating position, the bellows is crushed on itself, with jointing turns, which provides a thick and thermally insulating wall effective in preventing frosting up of its external surface during low temperature tests.

Very advantageously, the insulating bell and the bellows are made from the same material and are joined together, forming a single complex piece: despite its complex shape, this single piece may however be formed using conventional moulding techniques, particularly when it is made from silicone rubber. This one piece structure provides better sealing by doing away with connections between parts which often generate undesirable leaks. Furthermore, a very advantageous reduction is obtained of the number of component parts of the structure because the bellows is able to play the dual role of sealed duct of variable length and spring applying the bell resiliently against the support of the element whose temperature it is desired to regulate.

If it is further desired to overcome the drawbacks of poor sealing in the application of the bell against the support with which it is caused to cooperate, it is possible for the sidewall of the bell to be provided externally with a sheath, formed by a thin skirt situated at a distance therefrom, and so defining a peripheral chamber, a dry gas intake tube opening into this peripheral chamber.

BRIEF DESCRIPTION OF THE DRAWINGS

The invention will be better understood from the detailed description which follows of a preferred embodiment, given solely by way of non limitative example, with reference to the accompanying drawings in which.

DETAILED DESCRIPTION OF THE PREFERRED EMBODIMENTS

Figure 1:
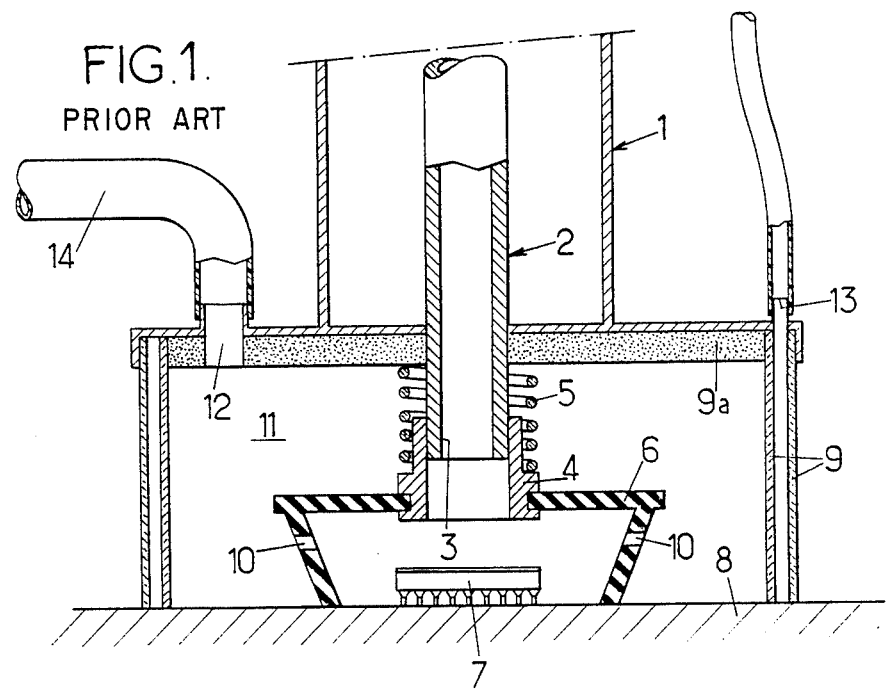
FIG. 1 is an illustration of the prior art and FIG. 2 is a schematic view in cross section of a thermal regulation device in accordance with the present invention, but wherein elements identical to those in FIG. 1 are designated by the same reference numerals.

Just like the device of the prior art shown in FIG. 1, the device of the invention comprises a body (simply suggested in the drawing and whose inner equipment has not been shown) through which passes a duct 2 bringing gas at the desired temperature, whose lower end 3 slidingly supports an outer sleeve 4. On the latter is crimped a bell 6 dimensioned and configured so as to cover an electronic component 7 mounted (mechanically and electrically) on a support 8.

A tubular bellows 15, substantially coaxial with duct 2 is sealingly inserted between bell 6 and the insulating bottom 16 of body 1; passages 17 are provided in the bottom wall of the bell so as to cause the inner volume of the bell to communicate with the annular chamber A defined by bellows 15. Advantageously, bellows 15 is formed from the same material as bell 6 and is made as a single piece therewith, e.g. by moulding. Thus, the formation of a connecting seal between the bellows and the bell is avoided and a possible cause of leaks during use is removed.

The material forming bell 6 and bellows 15 is a very good heat insulator so that their respective external surfaces which are in contact with the ambient atmosphere, are thermally insulated from the internal atmosphere; during very low temperature tests (e.g. −65° C.), it is thus certain that there will be no formation of condensation of the water vapour or frosting thereof. Advantageously, this material is silicone rubber.

Finally, and it is a question here also of an important structural simplification, the geometric configuration of the bellows and the nature of its component material may be determined so that the bellows is able to play the role of spring 5 of the prior art device and is capable of urging bell 16 downwardly so as to hold it resiliently and sealingly applied against the surface of support 8.

Figure 2:
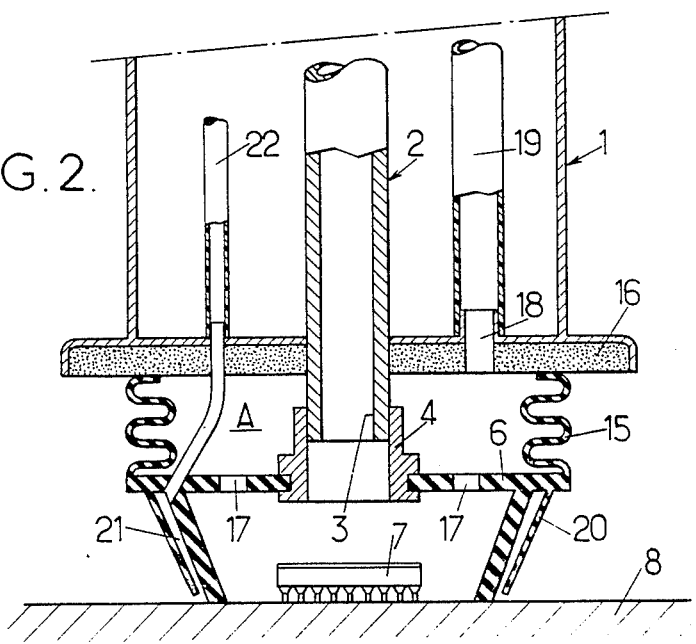

In addition, in order to simplify the structure and manufacture of bellows 15, the thickness of its wall is relatively small; since this small thickness is unsuitable for providing the desired thermal insulation, during use the bellows is completely crushed on itself, with jointing turns, which has the advantage of providing an effective thickness in use which is much more considerable, whereby a good thermal insulation is obtained as desired (in FIG. 2, bellows 15 has not been shown crushed on itself so that the drawing remains more readily readable).

The result is that the structure of the thermal regulation head of the invention has a considerable simplification with respect to the prior art structure since the insulating function of element 7 with respect to the ambient atmosphere is henceforth provided by one and only one piece easily positioned and not fragile.

The bottom 16 of the body is pierced with a passage 18 opening into the annular chamber A and to which a discharge tube 19 is connected which is situated inside body 1 and which extends over the whole height thereof. The gases are therefore discharged upwardly far from bell 6.

If the lower edge of bell 6 does not fit perfectly sealingly against the surface of support 8 of component 7 (the case of a bell with rectangular section, for example, whose faces are deformed under the effect of the internal overpressure), leaks result which may cause condensation of the humidity of the ambient atmosphere with a risk of frosting up in the case of low temperatures. It is possible to overcome this drawback by arranging for a passage of dry gas, particularly dry air, at the base of the bell. For this, it is possible to add to bell 6 an external peripheral skirt 20 with thin wall and relatively flexible, so as to define therewith a peripheral chamber 21. The width of this peripheral chamber 21 decreases from top to bottom (e.g. the bottom of skirt 20 is bent towards the lateral wall of the bell) so as to form a peripheral venturi which accelerates the dry air flow in line with possible leaks, thus preventing the formation of frost at these positions. The dry air is fed into chamber 21 through a tube 22 which is enclosed inside body 1 of the head in the same way as discharge tube 19 and which, after passing through the annular chamber A, emerges into the top part of the peripheral chamber 21.

As is evident and as it follows moreover from what has gone before, the invention is in no wise limited to those of its modes of application and embodiments which have been more particularly envisaged; it embraces, on the contrary, all variants thereof.

We claim:

1. Thermal regulation device used for regulating, to a desired positive or negative value, the temperature of an element, particularly a semi-conductor component, during electric testing under variable thermal conditions, said temperature regulation being obtained by blowing a gas at the desired temperature on said element, said thermal regulation device comprising a body (1) supporting an intake duct (2) for the gas at the appropriate temperature and means for insulating the element with respect to the ambient atmosphere, said insulating means comprising an insulating bell (6) covering the element (7) and supported slidingly by the free end of said duct, resilient means being inserted between the insulating bell and the body of the device and holding said bell in sealed relation against a support (8) of the element, characterized by the combination of the following arrangements:

- between the insulating bell (6) and the body (1) said resilient means comprises a tubular bellows (15) and is substantially coaxial with the gas intake duct and said bellows and is an annular chamber with the opposing walls of the insulating bell, of the body and of the duct, said bellows holding the bell resiliently and sealingly against the support of the element;
- the bell (6) and the bellows (15) are both made from a material or from respective materials which are very good heat insulators;
- the bell (6) is provided with at least one passage (17) between its inner volume and said annular chamber;
- the body (1) of the device has passing therethrough, over the whole of its height, a discharge tube (19) opening into the annular chamber at its lower end (at 18) and emerging into the atmosphere at its upper end.

2. Thermal regulation device according to claim 1, characterized in that the bellows (15) has a relatively thin wall and in that, in the operating position, the bellows is crushed on itself, with jointing turns, forming an effective thick and insulating wall.

3. Thermal regulation device according to claim 1, characterized in that the insulating bell (6) and the bellows (15) are made from the same material and are joined together, forming a single complex piece.

4. Thermal regulation device according to claim 3, characterized in that the single piece combining the insulating bell and the bellows is a moulded piece made from silicone rubber.

5. Thermal regulation device according to claim 1, characterized in that the sidewall of the bell (6) is provided externally with a sheath formed by a thin skirt (20) situated at a distance therefrom and defining a peripheral chamber (21) and in that a dry gas feed tube (22) opens into this peripheral chamber (21).

* * * * *